US005675542A

United States Patent [19]

Ford

[11] Patent Number: 5,675,542
[45] Date of Patent: Oct. 7, 1997

[54] MEMORY BIT-LINE PULL-UP SCHEME

[75] Inventor: Keith A. Ford, Colorado Springs, Colo.

[73] Assignee: Cypress Semiconductor Corp., San Jose, Calif.

[21] Appl. No.: 671,671

[22] Filed: Jun. 28, 1996

[51] Int. Cl.[6] .................................. G11C 7/00; G11C 7/02
[52] U.S. Cl. ............................... 365/189.11; 365/208
[58] Field of Search .......................... 365/189.11, 208

[56] References Cited

U.S. PATENT DOCUMENTS

| | | | |
|---|---|---|---|
| 5,093,806 | 3/1992 | Tran | 365/189.11 |
| 5,508,961 | 4/1996 | Han | 365/189.11 |
| 5,566,126 | 10/1996 | Yoshida | 365/208 |

Primary Examiner—David C. Nelms
Assistant Examiner—Trong Quang Phan
Attorney, Agent, or Firm—Blakely, Sokoloff, Taylor & Zafman, LLP

[57] ABSTRACT

A method and apparatus for reducing noise in a memory bit-line pull-up circuit. The memory bit-line pull-up circuit includes a first reference line, a second reference line, a first capacitor, a gating device, and a pull-down circuit. The circuit may further include a load transistor coupled between the first reference line and a first voltage conduit, which generally maintains the voltage on the first reference line at Vcc-Vt, and a second capacitor and the load transistor providing a pull-up path for the voltage on the first reference line when Vcc increases and the first capacitor. The pull-down circuit provides a pull-down path for the voltage on the first reference line when Vcc decreases. The first capacitor provides a pull-up path for the voltage on the second reference line. A first gating device couples a bit-line to the first reference line. The circuit further including a second gating device to couple a bit-line bar to the first reference line. By coupling the bit-line(s) to a second reference line through the gating device(s), the gating device(s) are partially turned on during a portion of the bit-line (or bit-line bar) recovery time. In other words, when the voltage on the bit-line (or bit-line bar) is less than the voltage on the reference line, then the coupling of the noise from the bit-line onto the first reference line is generally reduced relative to coupling the bit-line(s) to ground.

24 Claims, 3 Drawing Sheets

1

MEMORY BIT-LINE PULL-UP SCHEME

BACKGROUND OF THE INVENTION

1. Field of the Invention

The present invention relates generally to the field of integrated circuits. More particularly, the present invention relates to the field of memory devices.

2. Description of Related Art

Considerable progress continues to be made in the development of high-speed, low-power, high-density memory devices. The present invention typically relates to a bit-line pull-up scheme in a memory device. Bit-line pull-up schemes are used to establish a reference voltage (e.g., a global Vt down reference voltage) on each bit-line that is not selected for a reading or writing operation.

In many memory devices, all or most of the bit-line pairs are coupled to a global reference line which provides a conductive path throughout the integrated circuit. The global reference line provides a common reference voltage, typically at Vcc-Vt, for the non-selected bit-lines that are coupled to the global reference line. The global reference line is usually designed to track Vcc as close as possible, especially in memory devices that have very fast access times. When a global reference line does not precisely track Vcc, the access time may be pushed out leading to a decrease in the overall performance of the device.

The noise coupled onto the global reference line may prevent the global reference line from properly tracking Vcc and causing the access time to be pushed out. Unfortunately, the existing bit-line pull-up schemes are not capable of reducing the amount of noise that is coupled onto the global reference line. Most often, noise is coupled onto the global reference line when the voltage levels on the bit-lines change during a reading or writing operation. The present bit-line pull-up scheme has the capability of reducing the coupling of the bit-line noise onto the global reference line in order to reduce the likelihood that the noise on the global reference line will slow down the access time of the memory device. More specifically, the present invention reduces the noise coupling during the recovery portion of the read or write cycle.

FIG. 1 illustrates a typical column of memory cells 100 in a memory device. A memory device usually includes several columns of memory cells that creates the memory array within the memory device. According to FIG. 1, the memory cell 120a and the memory cell 120n are coupled to the bit-line pull-up circuit 110 and the sense amplifier 130 via the pair of bit lines 150a and 150b. Each pair of bit lines include a bit line 150a and its complement the bit line bar 150b. Typically, several memory cells (e.g. 128 memory cells) are coupled to a bit-line pair.

The memory cells 120a–n may be a four transistor SRAM memory cell well known in the art. For example, the memory cells 120a–n may include a flip-flop (formed by cross-coupling two inverters) and two access transistors. Typically, there are several memory cells coupled to each word line, which represents a row of memory cells.

To access a memory cell, for a reading or writing operation, the voltage on its word-line is raised. By raising the word-line voltage, the access transistors in each memory cell in the selected row is turned on and the flip-flop in each memory cell is coupled to a corresponding pair of bit lines. In other words, the access transistors act as transmission gates, allowing bi-directional current flow between the flip-flop and the pair of bit lines. Therefore, when the word line

2

160a is selected, the memory cell 120a flip-flop is coupled to the pair of bit lines 150a and 150b via the memory cell 120a access transistors. The voltage on the bit-line 150b is the complement of the voltage on the bit-line 150a. Similarly, when the word line 160n is selected, the memory cell 120n flip-flop is coupled to the pair of bit lines 150a and 150b via the memory cell 120n access transistors.

The following example illustrates how data may be accessed from one of the memory cells for either a reading or writing operation. Assume that the memory cell 120a is storing a logic "0" and the bit-lines 150a and 150b have been pulled up to the global line reference voltage by the bit-line pull-up circuit 110. When the memory cell 120a is accessed for a reading operation, the word-line 160a turns on the memory cell 120a access transistors to couple the memory cell 120a flip-flop (storing a "0") to the pair of bit lines 150a and 150b. This causes the voltage on the bit-line 150a to be pulled toward ground and the voltage on the bit-line 150b to be held at the global reference voltage. The resulting voltage difference between the bit-line 150a and the bit-line 150b is detected by the sense amplifier 130.

Furthermore, when the memory cell 120a is accessed for a reading operation, the sense amplifier 130 receives a column select signal from the column decoder at the input 180. The column select signal couples the pair of bits lines 150a and 150b to the data lines 170a and 170b, respectively. During the reading operation, the signals on the bits lines 150a and 150b are transferred from the bits lines 150a and 150b to the data lines 170a and 170b, respectively. The data stored in the memory cell 120 is then temporarily stored in the output data buffer 140 until outputted from the memory device.

Now assume that a logic "1" is to be written into the memory cell 120a. Therefore, the column select signal selects the column of memory cells 100 and couples the pair of bits-lines 150a and 150b to the data lines 170a and 170b, respectively. Next, a logic "1" is transferred from the data line 170a to the bit-line 150a and a logic "0" is transferred from the data line 170b to the bit-line 150b. Furthermore, the word-line 120a turns on the memory cell 120a access transistors to couple the memory cell 120a flip-flop to the bit-lines 150a and 150b. When this occurs, the voltage on the bit-line 150a is raised toward Vcc and the voltage on the bit-line 150b is lowered toward ground causing a logic "1" to be written into the memory cell 120a. The memory cell 120a stores the logic "1" indefinitely unless changed by another write operation.

FIG. 2 illustrates an existing bit-line pull-up circuit 200 in a memory device such as a SRAM device. According to FIG. 2 the global reference line 280 is coupled to the n-channel MOS transistor 210. The line 280 is referred to as the global reference line because it extends throughout the integrated circuit and may be coupled to all bit-lines. The bit-line pull-up circuit 200 pulls up the bit-lines 270a and 270b to the global reference line voltage when the bit-lines 270a and 270b are not selected for either a reading or writing operation. By coupling its gate terminal and one of its other terminals to Vcc, the transistor 210 establishes the global reference line voltage of Vcc - Vt (the threshold voltage of the transistor 210) also referred to as the global Vt down reference voltage.

The global reference line 280 is generally capable of tracking Vcc as it rises or declines to maintain the voltage of Vcc - Vt. According to FIG. 2, the capacitor 220 provides a pull-up path for the global reference line voltage and the transistors 230 and 240 provide a pull-down path for the global reference line voltage. Therefore, as Vcc rises, transistor 210 and capacitor 220 pull the global reference line voltage up and as Vcc declines, capacitor 220 and transistors 230 and 240 pull the global reference line voltage down in order to maintain the global reference line voltage at Vcc-Vt.

The capacitor 220 is a p-channel MOS transistor that is coupled between Vcc and the global reference line 280. The transistor 220 has its drain and its source coupled to Vcc and its gate coupled to the global reference line 280. The transistors 230 and 240 are weak n-channel transistors that are serially coupled between the global reference line 280 and ground. The gate and the drain of the transistor 230 is coupled to the global reference line 280. The source of the transistor 230 are coupled to the drain and the gate of the transistor 240. The source of the transistor 240 is coupled to ground.

The leaker transistors 250 and 260 respectively couple the bit-lines 270a and 270b to the global reference line 280. The bit-line 270b is the complement of the bit-line 270a and is also referred to as the bit-line bar 270b. The leaker transistors 250 and 260 are p-channel MOS transistors that have their gates coupled to ground. Therefore, the leaker transistors 250 and 260 are always turned on such that noise on the bit-lines 270a and 270b are capable of being coupled onto the global reference line 280, regardless of the voltage on the bit-lines 270a and 270b.

The pull-up circuit 200 may be well suited for larger memory devices (such as 256K devices and larger). Typically, the larger die that is associated with the larger memory devices, have more inherent capacitance. Due to the considerable capacitive coupling between Vcc and Vss in a larger memory device, the Vss noise coupled to the bit-lines is also coupled to Vcc, and pull-up circuit 200 will couple the Vcc noise sufficiently to the global reference circuit.

However, smaller memory devices typically have smaller die which provides less capacitive coupling between the power supplies. The reduced capacitive coupling allows Vss noise to be coupled to the bit lines without a similar coupling to Vcc. Therefore, it is desirable to minimize the coupling of Vss noise on the bit-lines 270a and 270b onto the global reference line 280. If a significant amount of Vss noise on the bit-lines 270a and 270b are coupled onto the global reference line 280, the global reference line 280 may be prevented from tracking Vcc. This may lead to a longer access time that slows down the overall performance of the memory device.

SUMMARY OF THE INVENTION

The present invention provides a memory bit-line pull-up scheme and methods of using the same. One embodiment of the present invention concerns a method for reducing noise in a memory bit-line pull-up circuit. The method of reducing noise includes the step of changing the voltage of a bit-line from a first voltage level to a second voltage level. The first and second voltage levels are different. Simultaneously with changing the voltage on the bit-line, a third voltage level is applied to a gating device that couples the bit-line to a reference line. The third voltage level is not equal to ground and is less than at least one of the first and second voltage levels.

Another embodiment of the present invention concerns a memory bit-line pull-up circuit. The memory bit-line pull-up circuit includes a first reference line, a second reference line, a first capacitor, a gating device and a pull-down circuit. The first reference line may be coupled to a first voltage conduit via a first capacitor and coupled to a second voltage conduit via a pull-down circuit. The first reference line may also be coupled to the first voltage conduit via a load transistor.

The gating device may include a first leaker transistor and (where a second bit-line is used) a second leaker transistor. The first leaker transistor couples a bit-line to the first reference line and the second leaker transistor couples the bit-line bar (which is the complement of the bit-line) to the first reference line. The gate(s) of the first and second leaker transistors are coupled to the second reference line. Furthermore, the second capacitor is coupled between the first reference line and the second reference line.

Other features and advantages of the present invention will be apparent from the accompanying drawings and from the detailed description that follows below.

BRIEF DESCRIPTION OF THE DRAWINGS

The present invention is illustrated, by way of example and not limitation, in the figures of the accompanying drawings, in which like references indicate similar elements and in which.

DETAILED DESCRIPTION

The following detailed description sets forth embodiments in accordance with the present invention for a memory bit-line pull-up scheme. In the following description, details are set forth such as specific circuitry configurations in order to provide a thorough understanding of the present invention. It will be evident, however, that the present invention may be practiced other than as explicitly described in these details. In other instances, the functioning of well-known circuit components, logic gates, etc., have not been described in particular detail so as not to obscure the present invention.

Figure 3:
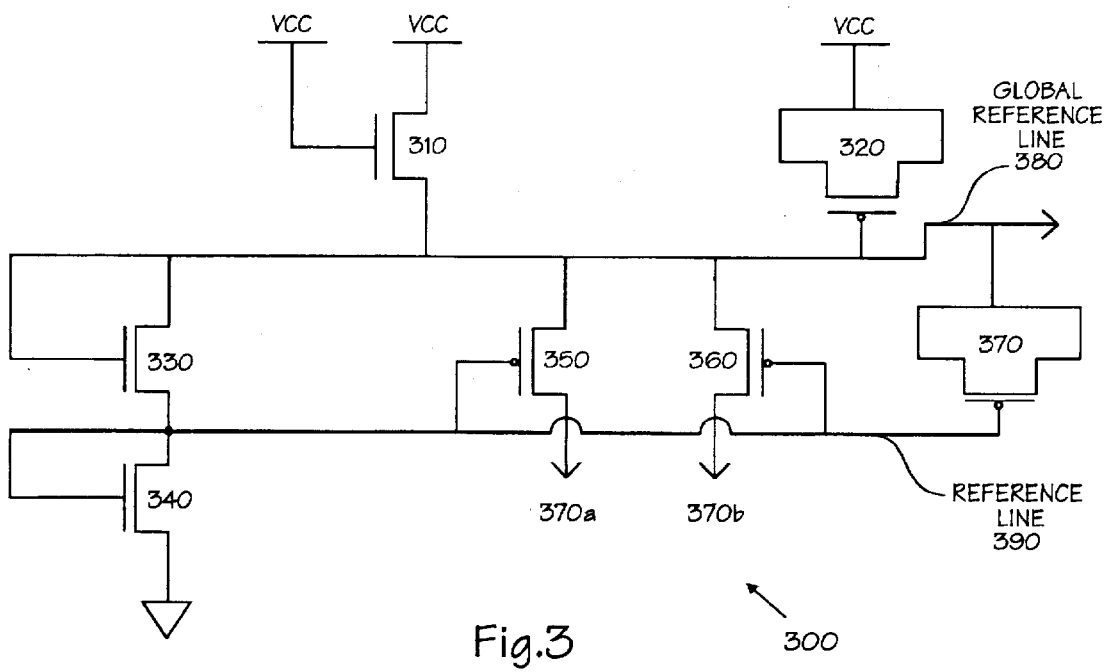
FIG. 3 is an illustration of one embodiment of a present bit-line pull-up circuit in a memory device.

The following description of the present invention concerns various methods and apparatuses for a memory bit-line pull-up scheme. FIG. 3 illustrates one embodiment of the present bit-line pull-up circuit 300. The circuit 300 includes a global reference line 380 that is coupled to a pair of bit-lines 370a and 370b. The bit-line 370b is the complement of the bit-line 370a and is also referred to as the bit-line bar 370b. For an alternative embodiment, a single bit-line may be used without a complementary bit-line. The n-channel MOS transistor 310 couples the global reference line 380 to Vcc such that the voltage of the global reference line 380 is at Vcc - Vt where Vt represents the threshold voltage of transistor 310. In one embodiment, Vcc is approximately 5 volts and Vt is approximately 1 volt such that the global reference line is at a voltage of approximately 4 volts.

If Vcc increases or decreases, the global reference line 380 is capable of tracking Vcc such that the global reference line 380 maintains a voltage of Vcc-Vt. If the global reference line voltage does not adequately track Vcc, the memory device may not perform at its optimum speed. Therefore, when the voltage at Vcc is increased, the capacitor 320, which is a p-channel MOS transistor, and n-channel MOS transistor 310 pull-up the global reference line 380 proportionately to the increase in Vcc. For example, if Vcc is raised from 5 volts to 6 volts, then the capacitor 320 and transistor 310 pull-up the global reference line 380 from 4 volts to 5 volts.

On the other hand, when Vcc decreases, the weak n-channel transistors 330 and 340 and capacitor 320, pull-down the global reference line 380 proportionately to the decrease in Vcc. The n-channel transistors 330 and 340 are small transistor devices relative to the load transistor 310 and therefore not capable of drawing as much current as the load transistor 310 when turned on. In one embodiment, the gate and the drain of the transistor 330 are coupled to the global reference line 380 and the source of the transistor 330 is coupled to the drain and the gate of the transistor 340. Furthermore, the source of the transistor 340 is coupled to ground. Therefore, as Vcc decreases, the transistors 330 and 340 provide a pull-down path for the current to flow from the global reference line 380 to ground reducing the voltage of the global reference line. For example, if Vcc falls from 5 volts to 4 volts, then the voltage level of the global reference line 380 drops from 4 volts to 3 volts.

The leaker transistors 350 and 360 couple the pair of bit-lines 370a and 370b to the global reference line 380. In one embodiment, the leaker transistors 350 and 360 are p-channel MOS transistors. When data is being accessed from the memory cells corresponding to the pair of bit-lines 370a and 370b, the bit of data read from or written into the memory cells determines the voltage level of each of the bit-lines 370a and 370b. For example, if a selected memory cell storing a logic "1" is accessed, then the bit-line 370a is pulled towards 4 volts and the bit-line 370b is pulled towards 0 volts. On the other hand, when a selected memory cell storing a logic "0" is accessed, then the bit-line 370a is pulled towards 0 volts and the bit-line 370b is pulled towards 4 volts.

Unlike the prior bit-line pull-up circuits, one embodiment of the present bit-line pull-up circuit couples the gates of the leaker transistors 350 and 360 to a reference line 390. In one embodiment, the reference line 390 is coupled to the source of the transistor 330 and the drain of the transistor 340. Therefore, if the global reference line 380 is at a voltage of 4 volts and the transistors 330 and 340 are approximately the same size and operate as a voltage divider, then reference line 390 is at approximately 2 volts.

The advantage of raising the gate voltage of the leaker transistors 350 and 360 is to reduce the amount of current flowing through the leaker transistors 350 and 360. By reducing the amount of current flowing through the leaker transistors 350 and 360, the amount of noise on the bit-lines 370a and 370b that is coupled onto the global reference line is also reduced. For example, if the reference line 390 is at approximately 2 volts, then the leaker transistors 350 and 360 couple approximately half as much of the Vss noise on the bit-lines 370a and 370b onto the global reference line 380, as compared to the bit-line pull-up scheme 200 shown in FIG. 2. By reducing the noise coupling, the access time of a memory device may be significantly increased.

In one embodiment, an SRAM memory device having reduced noise coupling has the capability of operating with a 15 nanosecond (ns) access time, whereas an SRAM memory device without the reduced noise coupling only has the capability of operating with a 30–50 ns access time. Therefore, by controlling the amount of current that is capable of flowing through the leaker transistors 350 and 360 (i.e., by raising the gate voltages of the leaker transistors 350 and 360), the overall performance of the SRAM device is improved.

To ensure that the voltage on the reference line tracks the transient changes in the global reference line voltage, a capacitor 370 is coupled between the global reference line 380 and the reference line 390. Therefore, if the global reference line voltage increases, then the capacitor 370 pulls-up the reference line voltage proportionately to the increase in the global reference line voltage. On the other hand, if the global reference line voltage decreases, then the transistor 340, which is coupled to ground, pulls-down the reference line voltage proportionately to the decrease in the global reference line voltage. In one embodiment, the voltage on the reference line 370 is maintained at approximately half the voltage on the global reference line 380 (e.g. 2 volts).

Figure 1:
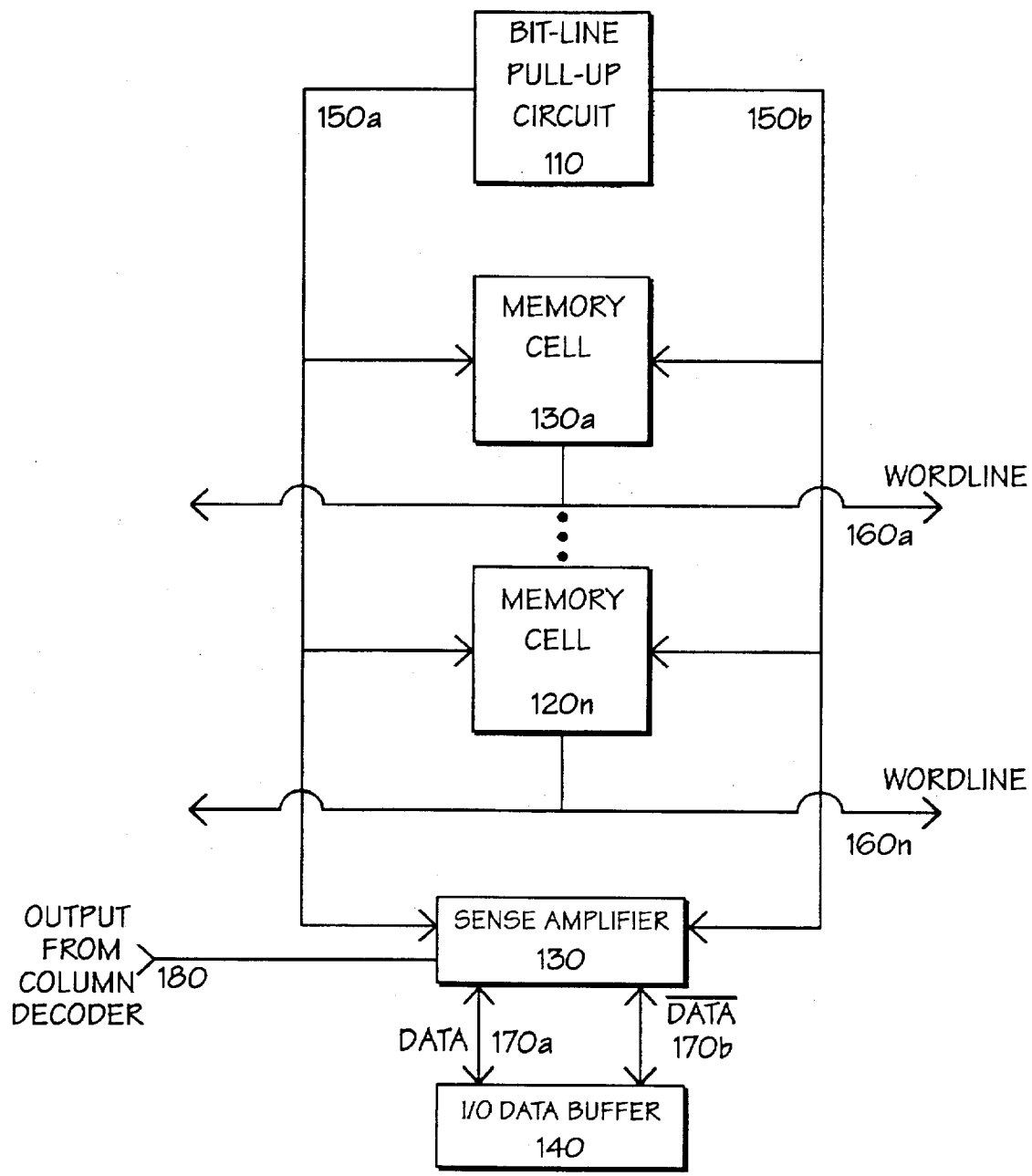
FIG. 1 is an illustration of a conventional column of memory cells in a memory device.
Figure 2:
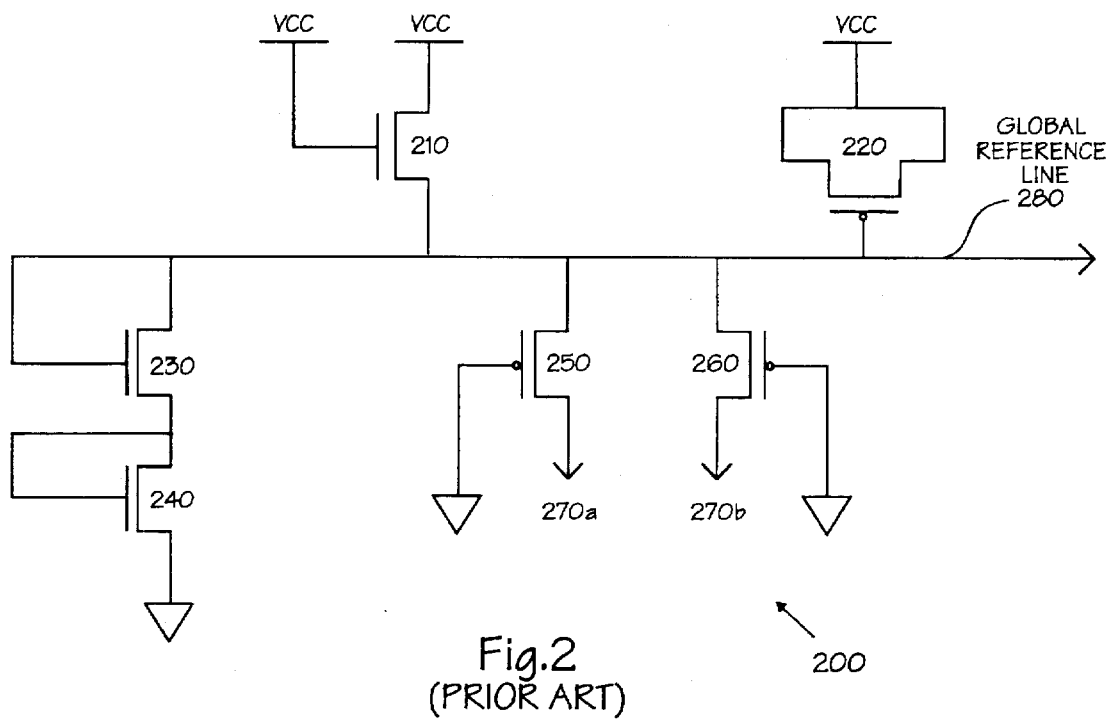
FIG. 2 is an illustration of a conventional bit-line pull-up circuit in a memory device.

The present invention is typically implemented in SRAM devices (such as a 64K SRAM device) but may also be implemented in other types of memory devices. In one embodiment of the invention, the W/L ratio of each MOS device 310, 330, 340, 350, 360, 320 and 370 is 681.6/1, 2/8, 2/8, 1.45/2.9, 1.45/2.9, 633.6/5 and 40/13.5, respectively. The width-to-length (W/L) ratio is measured as shown in Figure 2.8 of page 40 of "Principles of CMOS VLSI Design" by Neil H. E. Weste and Karan Eshraghian (Addison-Wesley Publishing Co., 1985), where the length (L) is the distance the majority charge carriers move in going from the source to the drain in the channel region. In one embodiment, the MOS device 320 operating as a capacitor is approximately 1.1 to 50 times more preferably six times the size of the MOS device 370 operating as a capacitor.

The following example illustrates how the present bit-line pull-up scheme reduces the bit-line noise coupling onto the global reference line 380. As previously discussed, Vss noise on a bit-line typically occurs when the bit-line switches voltage levels. Therefore, the time it takes to switch voltage levels is referred to as the recovery time. The coupling of the bit-line noise onto the global reference line is reduced by providing the capability to partially couple the bit-line noise during a portion of the recovery time while fully coupling the bit-line noise during the other portion of the recovery time.

Assume that Vcc is at approximately 5 volts, the global reference line 380 is at approximately 4 volts and the reference line is at approximately 2 volts. Therefore, when at least one of the memory cells corresponding to the pair of bit-lines 370a and 370b is accessed, the bit-lines 370a and 370b are raised or lowered to the appropriate voltage levels. For example, if the memory cell, storing a logic "1", is selected for a reading operation, then the bit-line 370a is pulled towards 4 volts and the bit-line 370b is pulled towards ground. In one embodiment, the bit-lines may be fully excurted (i.e. having a maximum voltage swing between 0 volts and 4 volts). However, in an alternative embodiment, such as in a very fist SRAM device, the bit-lines may not be fully excurted. For example, the voltage swing on the bit-lines may only be 2 volts, rather than 4 volts.

Once the reading operation is completed, the bit-line pull-up circuit 300 pulls the bit-lines 370a and 370b up to the global reference line voltage. The global reference line voltage is held there until the bit-lines 370a and 370b are accessed again.

The advantage of gating the leaker transistors 350 and 360 with the reference line voltage, which is typically a voltage between the global reference line voltage and ground, is that the leaker transistors 350 and 360 are partially turned on when the bit-line voltage is less than the reference line voltage. Therefore, when the bit-line voltage is less than 2 volts, in one embodiment, than only half as much current (as compared to when the leaker transistors 350 and 360 are fully turned on) flows through the leaker transistors 350 and 360 onto the global reference line 380. This means that only half as much noise (as compared to when the leaker transistors 350 and 360 are fully turned on) from the bit-lines 370a and 370b are coupled onto the global reference line 380. Although the coupling of the bit-line noise onto the global reference line 380 is partially reduced when the bit-line voltage is less than the reference line voltage (e.g. 2 volts), the coupling of the bit-line noise onto the global reference line 380 is not reduced when the bit-line voltage is greater than the reference line voltage (i.e. 2 volts).

For example, if the voltage on the bit-line 370a is between 0 volts and 2 volts, then noise on the bit-line 370a is partially coupled onto the global reference line 380. On the other hand, if the voltage on the bit-line 270a is between 2 volts and 4 volts, then the noise on the bit-line is fully coupled onto the global reference line 390. Notwithstanding the fact that the noise coupling is reduced when the bit-line voltage is less than a predetermined voltage (i.e. the reference line voltage), the overall noise coupling is reduced improving the overall performance of the SRAM device.

Another advantage of gating the leaker transistors 350 and 360 with the reference line voltage is that the power consumption may be reduced in some of the slower SRAM devices such as an SRAM device having an access time of 20 ns or slower. More specifically, the power savings typically occurs when the bit-lines are fully excurted (which occurs most often in the slower SRAM devices) when switching voltage levels. After the bit-lines are fully excurted, the leaker transistors 350 and 360 reduce the amount of current (ICC) flowing from the SRAM memory array. In one embodiment, the current is reduced approximately 5 milliamps (mA) at low frequencies.

Figure 4:
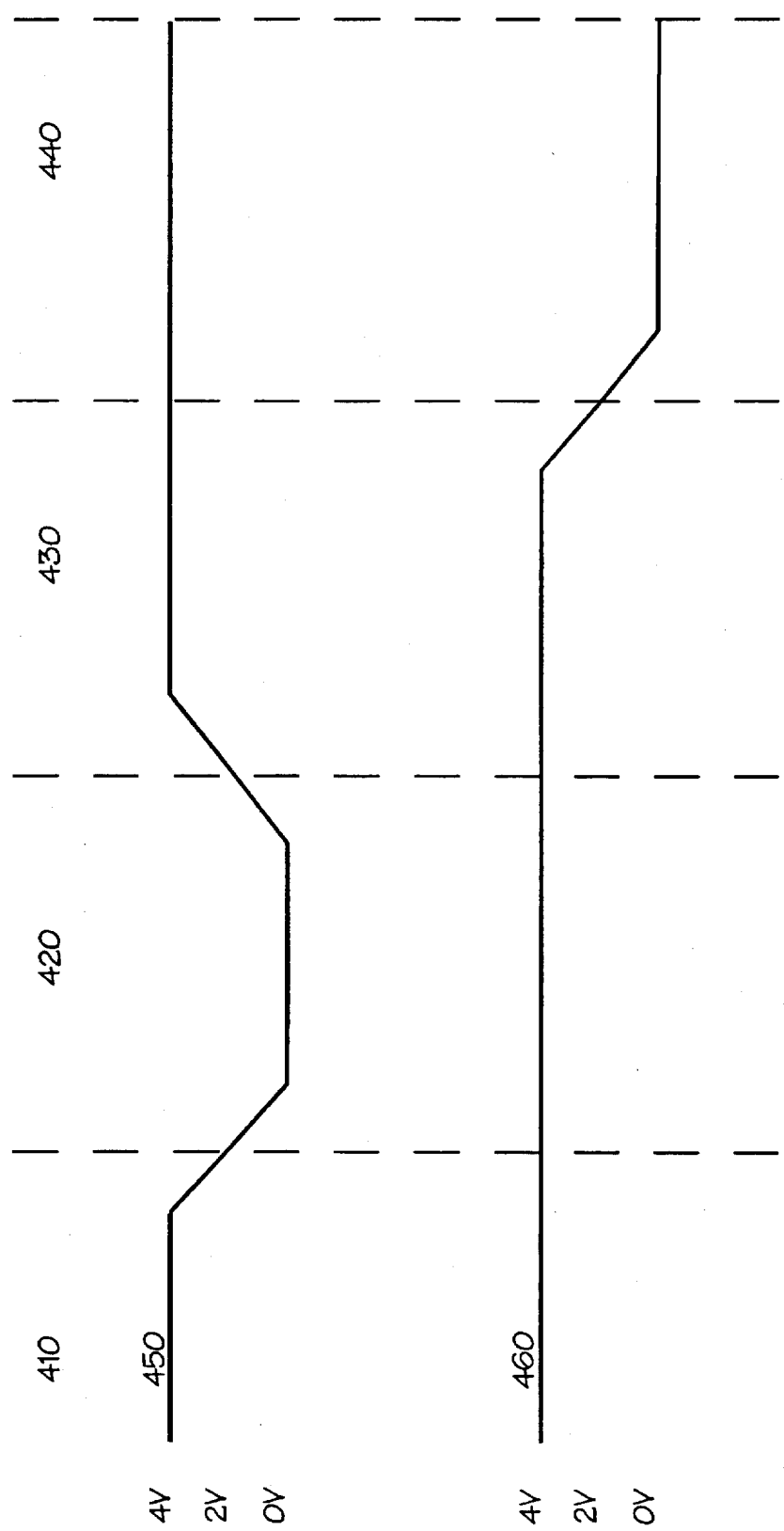
FIG. 4 is an illustration of the voltage waveforms on a pair of bit-lines.

FIG. 4 illustrates the voltage levels for a pair of bit-lines. The voltage waveform 450 represents the voltage on a bit-line and the voltage waveform 460 represents the voltage of its corresponding bit-line bar. Although the voltage waveforms 450 and 460 in FIG. 4 are fully excurted (i.e. full voltage swing between 0 volts and 4 volts), the voltage waveforms in other embodiments may not have a full voltage swing. For instance, faster SRAM devices require faster switching times, therefore, the bit-lines in most fast SRAM devices are not fully excurted when switching voltage levels.

According to FIG. 4, the waveforms 450 and 460 are divided into four time periods—410, 420, 430 and 440. During the time periods 410 and 430, the pair of bit-lines are not selected for a reading or writing operation, therefore, both bit-lines are pulled to 4 volts by the present bit-line pull-up scheme. During the time periods 420 and 440, the pair of bit-lines are selected for either a reading or writing operation. In other words, at least one of the memory cells coupling the pair of bit-lines is selected to be accessed such that data may be written into it or read from it. During the time period 420, a logic "0" is either read from or written into the selected memory cell. On the other hand, during the time period 440, a logic "1" is either read from or written into the selected memory cell. In general, the coupling of bit-line noise onto the global reference line 380 is reduced when one of the bit-lines has a voltage level below the reference voltage.

Suppose the memory cell corresponding to the pair of bit-lines is selected for a reading operation and the reference line voltage is at 2 volts. Therefore, the voltage waveform 450, corresponding to a selected bit-line, is pulled from 4 volts to 0 volts and the voltage waveform 460, corresponding to the selected bit-line bar, is maintained at 4 volts since the memory cell is currently storing a logic "0". As the voltage waveform 450 drops from 4 volts to 2 volts, the Vss noise on the corresponding bit-line is capable of being fully coupled onto the global reference line 380. However, as the voltage waveform 450 drops from 2 volts to 0 volts, the Vss noise on the corresponding bit-line is only capable of being partially coupled onto the global reference line 380.

In other words, during the first portion of the recovery time between 4 volts and 2 volts, the corresponding leaker transistor 350 is fully turned on and allows current, including any noise glitches, from the corresponding bit-line 370a to flow through it and onto the global reference line 380. But, during the second portion of the recovery time between 2 volts and 0 volts, the corresponding leaker transistor 350 is partially turned on allowing only half as much current from the corresponding bit-line 370a to flow through it and onto the global reference line 380. Therefore, noise coupled onto the global reference line 380 is capable of being reduced during the second portion of this recovery time.

Once the reading operation is completed, then the voltage waveform 450 is pulled back up to 4 volts by the bit-line pull-up circuit and the voltage waveform 460 is still maintained at 4 volts. When the voltage waveform 450 is pulled from 0 volts to 2 volts, the corresponding leaker transistor 350 is only partially turned on allowing only a portion of the current from its corresponding bit-line 370a to flow through it and onto the global reference line 380. However, during the second portion of the recovery time when the voltage waveform 450 is pulled from 2 volts to 4 volts by the bit-line pull-up circuit, the corresponding leaker transistor 350 is fully turned on. Thus, the noise coupled onto the global reference line 380 is capable of being reduced during the first portion of this recovery time.

Suppose now that the memory cell corresponding to the pair of bit-lines is selected for a writing operation in which a logic "1" is to be written into the memory cell. Therefore, the voltage waveform 450, corresponding to a selected bit-line, is maintained at 4 volts while the voltage waveform 460 corresponding to a selected bit-line bar is pulled from 4 volts down to 0 volts.

Therefore, when the voltage waveform 460 is pulled from 4 volts down to 2 volts, the corresponding leaker transistor 360 is fully turned on when the corresponding bit-line 370b is between 4 volts and 2 volts and partially turned on when the corresponding bit-line 370b is between 2 volts and 0 volts. On the other hand, when the voltage waveform 460 is raised back to the global reference line voltage after a logic "1" is written into the memory cell and the bit-line pair is de-selected, then the leaker transistor 360 is partially on when the corresponding bit-line 370b is between 0 volts to 2 volts and fully on between 2 volts and 4 volts. Therefore, when the leaker transistor 360 is partially on, the amount of noise coupled onto the global reference line 380 is capable of being reduced and when the leaker transistor 360 is fully on, the noise coupling is not capable of being reduced. Therefore, the overall bit-line noise coupling onto the global reference line 380 is capable of being reduced by partially coupling the bit-line noise during a portion of the recovery time when a bit-line switches voltage levels.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regard in an illustrative rather than a restrictive sense.

I claim:

1. A memory bit-line pull-up circuit, comprising:
   (a) a first reference line;
   (b) a second reference line;
   (c) a first capacitor coupled between said first reference line and said second reference line;
   (d) a pull-down circuit coupled between said first reference line and a first voltage conduit;
   (e) a first gating device coupled to a bit-line and to said first and said second reference lines.

2. The bit-line pull-up circuit of claim 1, further comprising:
   (f) a second capacitor coupled between said first reference line and a second voltage conduit; and
   (g) a load transistor coupled between said first reference line and said second voltage conduit.

3. The bit-line pull-up circuit of claim 2, wherein said first and said second capacitors are p-channel MOS transistors.

4. The bit-line pull-up circuit of claim 3, wherein said first capacitor is 1.1 to 50 times the size of said second capacitor.

5. The bit-line pull-up circuit of claim 1, wherein said pull-down circuit comprises a first transistor and a second transistor, wherein a first and a second terminal of said first transistor are coupled to said first reference line, a third terminal of said first transistor is coupled to a first and a second terminal of said second transistor, and a third terminal of said second transistor is coupled to said first voltage conduit.

6. The bit-line pull-up circuit of claim 5 wherein said first transistor and said second transistor are n-channel MOS transistors.

7. The bit-line pull-up circuit of claim 5, wherein said second reference line is coupled to said third terminal of said first transistor and said first terminal of said second transistor.

8. The bit-line pull-up circuit of claim 1, wherein said first reference line has a voltage level at approximately Vcc-Vt and said second reference line has voltage level at approximately (Vcc-Vt)/2.

9. The bit-line pull-up circuit of claim 2, wherein said load transistor is an n-channel MOS transistor and has a second terminal and a second terminal coupled to said first voltage conduit and a third terminal coupled to said first reference line.

10. The bit-line pull-up circuit of claim 1, wherein said gating device comprises a p-channel MOS transistors.

11. The bit-line pull-up circuit of claim 1, further comprising:
   a second gating device coupled to said first and second reference lines in parallel with said first gating device and to a second bit-line.

12. A memory, comprising:
   a memory cell;
   a bit line coupled to said memory cell; and
   a memory bit-line pull-up circuit having first and second reference lines, a first capacitor coupled between said first and said second reference lines a pull-down circuit coupled between said first reference line and a first voltage conduit and a first gating device coupled to said bit-line and to said first and said second reference lines.

13. The memory of claim 12, wherein said bit line pull-up circuit further includes a second capacitor coupled between said first reference line and a second voltage conduit; and a load transistor coupled between said first reference line and said second voltage conduit.

14. The memory of claim 13 wherein said first and said second capacitors are p-channel MOS transistors.

15. The memory of claim 14, wherein said first capacitor is 1.1 to 50 times the size of said second capacitor.

16. The memory of claim 12, wherein said pull-down circuit comprises a first transistor and a second transistor, wherein a first and a second terminal of said first transistor are coupled to said first reference line, a third terminal of said first transistor is coupled to a first and a second terminal of said second transistor, and a third terminal of said second transistor is coupled to said first voltage conduit.

17. The memory of claim 16 wherein said first transistor and said second transistor are n-channel MOS transistors.

18. The memory of claim 17, wherein said second reference line is coupled to said third terminal of said first transistor and said first terminal of said second transistor.

19. The memory circuit of claim 12, wherein said first reference line has a voltage level at approximately Vcc-Vt and said second reference line has voltage level at approximately (Vcc-Vt)/2.

20. The memory of claim 13, wherein said load transistor is an n-channel MOS transistor and has a second terminal and a second terminal coupled to said first voltage conduit and a third terminal coupled to said first reference line.

21. The memory of claim 12, wherein said gating device comprises a p-channel MOS transistors.

22. The memory of claim 12, wherein said pull-up circuit further includes a second gating device coupled to said first and second reference lines in parallel with said first gating device and to a second bit-line.

23. A method of pulling up a bit line of a memory cell, said memory cell having a first reference line at a first potential, a second reference line at a second potential between said first potential and ground and a gating device coupling said bit line to said first reference line and being coupled to said second reference line, said method comprising the steps of;
   accessing said memory cell such that a potential of said bit line falls below said second potential of said second reference line; and
   raising said potential of said bit line to said first potential of said first reference line through said gating device after said step of accessing has been completed.

24. A method as in claim 23 wherein said second potential is approximately half of said first potential.

* * * * *